United States Patent [19]

von Gentzkow et al.

[11] Patent Number: 5,817,736

[45] Date of Patent: *Oct. 6, 1998

[54] EPOXY RESIN MIXTURES FOR PREPREGS AND COMPOSITES BASED ON PHOSPHORUS-MODIFIED EPOXIES, DICY AND/OR AMINOBENZOIC COMPOUNDS

[75] Inventors: Wolfgang von Gentzkow, Kleinsendelbach; Jürgen Huber, Erlangen, both of Germany

[73] Assignee: Siemens Aktiengesellschaft, München, Germany

[ * ] Notice: The term of this patent shall not extend beyond the expiration date of Pat. No. 5,587,243.

[21] Appl. No.: 793,289

[22] PCT Filed: Aug. 25, 1995

[86] PCT No.: PCT/DE95/01136

§ 371 Date: Mar. 10, 1997

§ 102(e) Date: Mar. 10, 1997

[87] PCT Pub. No.: WO96/07685

PCT Pub. Date: Mar. 14, 1996

[30] Foreign Application Priority Data

Sep. 9, 1994 [DE] Germany ............... 44 32 189.9

[51] Int. Cl.$^6$ ............. C08G 59/30; C08G 59/40; C08G 59/52; C08G 59/54
[52] U.S. Cl. ............. 528/108; 528/93; 528/94; 528/103; 528/367; 528/368; 528/398; 528/399; 525/502; 525/504; 525/505; 525/507; 525/525; 428/413; 428/415; 428/417; 428/901
[58] Field of Search ............ 528/103, 93, 94, 528/108, 367, 368, 398, 399; 525/502, 504, 505, 507, 525; 428/413, 415, 417, 901

[56] References Cited

U.S. PATENT DOCUMENTS 3,741,858  6/1973  Fujiwara et al. .......... 161/185
4,111,909  9/1978  Simons ..................... 528/123
5,376,453  12/1994  Gentzkow et al. ........ 428/415
5,587,243  12/1996  Von Gentzkow et al. ... 428/413

FOREIGN PATENT DOCUMENTS 2158361       9/1994  Canada ................. 528/108
0 384 940 B1  9/1990  European Pat. Off. .
1934715       7/1969  Germany .............. 528/114
43 08 184 A1  9/1994  Germany .
43 08 185 A1  9/1994  Germany .
58-142.913    8/1983  Japan .
1-123.892     5/1989  Japan .

OTHER PUBLICATIONS

Derwent Abstracts 89–184,043, "Reactive Flame Retardant Composition", Nov. 1987.
"Handbook of Epoxy resins", McGraw Hill Book Company, 1967, pp. 10–12.
"Reactive flame retardant composition–containing compounds obtained by reacting acid phosphate ester with di:glycidyl ether compound useful in thermosetting resins", WPI/Derwent Publications, London, GB, AN 89–184 043.
"Der IR–Lotprozebss aus der Sicht des Basismaterialherstellers", Von H. Schumacher, Galvanotechnik, D–88348 Saulgau, 84 (1993) 11, pp. 3865–3870.

Primary Examiner—Frederick Krass
Attorney, Agent, or Firm—Kenyon & Kenyon

[57] ABSTRACT

Epoxy resin mixtures to produce prepregs and composites contain the following components:
  a phosphorus-modified epoxy resin with an epoxy value of 0.02 to 1 mol/100 g, made up of structural units derived from
    (a) polyepoxy compounds with at least two epoxy groups per molecule and
    (b) phosphinic acid anhydrides, phosphonic acid anhydrides or phosphonic acid half-esters;
  dicyandiamide and/or an aminobenzoic acid derivative as the hardener;
  an amino hardening accelerator.

17 Claims, No Drawings

EPOXY RESIN MIXTURES FOR PREPREGS AND COMPOSITES BASED ON PHOSPHORUS-MODIFIED EPOXIES, DICY AND/OR AMINOBENZOIC COMPOUNDS

This application is a 371 of PCT/DE95/01136 Aug. 25, 1995.

BACKGROUND OF THE INVENTION

The invention concerns epoxy resin mixtures for producing prepregs and composites and also the prepregs and composites produced from these epoxy resin mixtures.

Composites based on epoxy resins and organic or inorganic reinforcing materials have become extremely important in many areas of industry and daily life. The reasons include first the relatively simple and reliable processing of epoxy resins and, second, the good level of mechanical and chemical properties of cured epoxy resin molded materials adapt them to different applications and to utilize the properties of all the materials involved in the composite to advantage.

Epoxy resins are preferably processed to composites by way of the production of prepregs. For this purpose, organic or inorganic reinforcing materials or embedding components in the form of fibers, nonwovens and wovens or of flat shaped articles are impregnated with the resin. In most cases this is done with a solution of the resin in an easy-to-evaporate or easy-to-volatilize solvent. The resulting prepregs must not be tacky after this process, but they must not be fully cured either, and instead the resin matrix should merely be in a prepolymerized state. Furthermore, the prepregs must have sufficient stability in storage. For example, at least three months' stability in storage is required for the production of circuit boards. In further processing to yield composites, the prepregs must also melt on at elevated temperatures and they must form a strong and durable bond under pressure with the reinforcing materials and embedding components as well as the materials used for the composite, i.e., the cross-linked epoxy resin matrix must have a high interfacial adhesion with the reinforcing materials and embedding components as well as the materials to be bonded such as metals, ceramics, minerals and organic materials.

When cured, composites are generally required to have a high mechanical strength and thermal stability as well as a good chemical resistance and heat distortion and a high resistance to aging. For electronic and electrotechnical applications, constantly high electric insulation properties are also required, and there are various other additional requirements for special applications. For example, use as a circuit board material requires a high dimensional stability over a wide temperature range, good adhesion to glass and copper, a high surface resistivity, a low dielectric loss factor, good machinability (punchability, drillability), low water absorption and a high corrosion resistance.

Flame resistance is a requirement that has become increasingly important in recent times. In many areas, e.g., for construction materials for aircraft and automotive engineering and for vehicles in public transportation, this requirement has top priority because of the risk to humans and property. Flame resistance of circuit board materials is indispensable for electrotechnical and electronic applications in particular because of the high value of the electronic components mounted on them.

Therefore, one of the strictest material tests, namely the V-0 classification according to UL 94 V, must be passed to evaluate flammability. In this test, a test object is exposed to a defined flame positioned vertically at its lower edge. The total burning time in ten tests must not exceed 50 sec. This requirement is difficult to meet, especially when the material is thin, which is the case in electronics. Epoxy resin, which is used industrially throughout the world for FR4 laminates, meets these requirements only because it contains approx. 30% to 40% ring-brominated aromatic epoxy components, based on the resin, i.e., approx. 17% to 21% bromine. Comparably high concentrations of halogen compounds are used for other applications, often combined with antimony trioxide as a synergist. The problem with these compounds is that although they have excellent flame-retardant properties, they also have some highly objectionable properties. For example, antimony trioxide is listed as a carcinogen, and not only does chemical decomposition of aromatic bromine compounds release free bromine radicals and hydrogen bromide, which are highly corrosive, but also when highly brominated aromatics in particular decompose in the presence of oxygen, they form the highly toxic polybromine dibenzofurans and polybromine dibenzodioxins. Disposing of brominated refuse and toxic wastes also poses considerable problems.

For these reasons, there has been no lack of attempts to replace bromine-containing fireproofing agents with less problematical substances. For example, fillers with a extinguishing gas effect such as aluminum oxide hydrates (see "J. Fire and Flammability," vol. 3 (1972), pp. 51 ff.), basic aluminum carbonates (see "Plast. Engng." vol. 32 (1976) pages 41 ff.) and magnesium hydroxides (European Patent Application 243,201) as well as vitrifying fillers such as borates (see "Modern Plastics," vol. 47 (1970), no. 6, pages 140 ff.) and phosphates (U.S. Pat. No. 2,766,139 and U.S. Pat. No. 3,398,019) have been proposed. However, all these fillers have the disadvantage that they often seriously impair the mechanical, chemical and electric properties of the composites. In addition, [such fillers] require special processing techniques which are usually more expensive because they have a tendency to sediment and increase the viscosity of the resin system in which they are used as fillers.

The flame-retardant effect of red phosphorus has already been described (British Patent 1,112,139), in some cases combined with extremely finely divided silicon dioxide or aluminum oxide hydrate (U.S. Pat. No. 3,373,135). This yields materials whose use for electronic and electrotechnical purposes is limited because of the phosphoric acid formed in the presence of moisture and the resulting corrosion. Furthermore, organic phosphorus compounds such as phosphoric acid esters, phosphonic acid esters and phosphines have been proposed as flame-retardant additives (see: W. C. Kuryla and A. J. Papa "Flame Retardancy of Polymeric Materials," vol. 1, Marcel Dekker, Inc., New York, 1973, pages 24 to 38 and 52 to 61). However, this alternative has not been very promising, either, because these compounds are also known for their plasticizing properties and are used world-wide as plasticizers on a large scale (British Patent 10,794).

To achieve a flame resistance that complies with UL 94 V-0, it is known from German Patent Application 3,836,409 that prepregs can be produced by impregnating certain reinforcing materials or flat shaped articles using a suspension of halogen-free fire-proofing agents containing nitrogen and phosphorus in a solution of aromatic, heterocyclic and/or cycloaliphatic epoxy resins (in ring-halogenated form or a non-ring-halogenated form with a low halogen content) and aromatic polyamines and/or aliphatic amides as the hardener. The fireproofing agents here are halogen-free melamine resins or organic phosphoric acid esters, specifically melamine cyanurates, melamine phosphates, triphenyl phosphate and diphenyl cresyl phosphate as well as mixtures thereof. However, this is not a very promising solution because these fillers always increase water absorption and therefore the products cannot pass specific tests for circuit boards.

Organic phosphorus compounds that can be anchored in the epoxy resin network such as phosphorus compounds containing epoxy groups can also be used to make epoxy resins flame retardant. For example, European Patent 384, 940 discloses epoxy resin mixtures containing commercially available epoxy resin, the aromatic polyamine 1,3,5-tris(3-amino-4-alkylphenyl)-2,4,6-trioxohexahydrotriazine and an epoxy group-containing phosphorus compound based on glycidyl phosphate, glycidyl phosphonate or glycidyl phosphinate. Flame-retardant laminates or composites that can be classified according to UL 94 V-0 —without a halogen additive—and have a glass transition temperature of >200° C. can be produced with such epoxy resin mixtures. In addition, these epoxy resin mixtures can be processed by methods comparable to those used with the epoxy resins currently in use.

Circuit boards form the basis for manufacturing electronic assemblies. They are used to connect a wide variety of electronic and microelectronic components to form electronic circuits. The components are mounted on the circuit board by gluing or soldering using complex, highly automated assembly processes. There is also a trend toward increasingly economic manufacturing methods in assembly of printed circuit boards.

Therefore, IR reflow soldering is being used increasingly in SMD technology and will largely replace other soldering techniques in the future. In this process, the entire circuit board is heated by IR irradiation to temperatures >260° C. within a few seconds. Water absorbed in the circuit board is then vaporized all at once. Only laminates with very good interlaminar adhesion will withstand IR soldering processes without being destroyed by delamination. To reduce this risk, expensive conditioning processes have been proposed (see "Galvanotechnik" vol. 84 (1993) pages 3865–3870).

In this regard, mainly the so-called multilayer circuit boards (ML), which constitute a majority of the circuit boards produced today, are critical. Such circuit boards include several structured conductor planes which are spaced and insulated with respect to each other by epoxy resin composites. The trend in multilayer circuit board technology is toward larger and larger numbers of structured conductor planes. Thus multilayer circuit boards with more than 20 structured conductor planes are manufactured at the present. Since an excessive overall thickness of these circuit boards must be avoided for technical reasons, the distance between the structured conductor planes has become smaller and smaller and thus the interlaminar adhesion and the copper adhesion in multilayer circuit board laminates has also become more problematical. In IR soldering, especially high demands are also made on this type of circuit boards with regard to solder bath resistance.

As stated above, it is already known from European Patent 384,940 that laminates with the required high flame resistance can be produced without halogen by phosphorus modification of impregnating resins. In manufacturing experiments, however, it has been found that there is a risk of delamination in IR soldering with phosphorus-modified laminates. Therefore, there is an urgent need for electro-laminates where the required flame resistance is achieved without the use of halogens, e.g., by incorporating phosphorus into the resin matrix, but where the laminates are suitable for IR soldering, which has been introduced into SMD technology. Electro laminates with an extremely high solder bath resistance are needed for this purpose.

In circuit board technology, mainly the high-pressure cooker test (HPCT) and the determination of the solder bath resistance are used to test the suitability of laminates for a high thermal stressing. In HPCT a laminate sample (5×5 cm) from which copper has been removed is stressed for two hours at 120° C. under a steam pressure of approx. 1.4 bar and then stored floating in a solder bath at 260° C., and the time until delamination is measured. Good quality laminates do not show any delamination for up to >20 sec under these conditions. The solder bath resistance is determined on 2×10 cm laminate specimens which are immersed in a solder bath at 288° C. and the time until delamination is measured.

Adequate stability of the base materials in storage is another important requirement for industrial use. This is true in particular for prepregs for manufacturing multilayer circuit boards. Special copper-laminated inner layers are pressed with prepregs and copper foils. A precisely adjusted reactivity and optimum flow properties are prerequisites in the compression molding process to produce multilayer circuit boards with optimum interlaminar adhesion and thus a solder bath resistance to withstand IR soldering processes without risk of destruction due to delamination. These processing properties are achieved in the semifinished products. To assure that the processing properties are still met in the manufacture of multilayer circuit boards, a storage stability of >3 months is required of the prepregs. The reactivity must not change more than 10% within this period of time. So far it has been difficult to meet this requirement with halogen-free flame-retardant circuit board base materials. Thus, the storage stability of prepregs can be impaired by measures for incorporating organic phosphorus components and for improving interlaminar adhesion and solder bath resistance.

SUMMARY OF THE INVENTION

The object of this invention is to provide technically simple and thus inexpensively accessible epoxy resin mixtures that can be processed by methods comparable to those used with the epoxy resins in industrial use and—thanks to the required stability in storage—are suitable for producing prepregs and laminates for the multilayer technology that yield flame-retardant molded materials (i.e., classifiable according to UL 94 V specifications) without halogen additives while at the same time having such a great solder bath resistance that IR soldering processes are possible without delamination.

DETAILED DESCRIPTION OF THE INVENTION

This is achieved according to this invention by the fact that the epoxy resin mixtures contain the following components:
  a phosphorus-modified epoxy resin with an epoxy value of 0.02 to 1 mol/100 g, made up of structural units derived from:
    (A) polyepoxy compounds with at least two epoxy groups per molecule and
    (B) phosphinic acid anhydrides, phosphonic acid anhydrides or phosphonic acid half-esters;
  dicyandiamide and/or an aromatic amine of the following structure as a hardener:

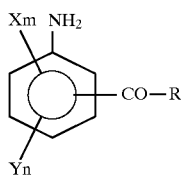

where
- X denotes a hydrogen atom and Y is an alkyl group with 1 to 3 C atoms, and m and n each denote an integer from 0 to 4 with the provision that m+n=4,
- R is an OH group or an $NR^1R^2$ group, where the $R^1$ group and the R2 group independently of each other denote a hydrogen atom, an alkyl group with 1 to 3 C atoms or an aralkyl group, or one of the $R^1$ and $R^2$ groups has this meaning and the other denotes an $NR^3R^4$ group, $R^3$ and $R^4$=H or an alkyl with 1 to 3 C atoms, or R1 and $R^2$ together with the nitrogen form a heterocyclic group;
- an amino hardening accelerator.

The phosphorus-modified epoxy resins contained in the epoxy resin mixtures according to the invention are produced by reacting conventional commercial polyepoxy resins (polyglycidyl resins) with the following phosphorus compounds:

phosphinic acid anhydrides: anhydrides of phosphinic acids with alkyl, alkenyl, cycloalkyl, aryl or aralkyl groups; examples include dimethyl phosphinic acid anhydride; methylethyl phosphinic acid anhydride, diethyl phosphinic acid anhydride, dipropyl phosphinic acid anhydride, ethylphenyl phosphinic acid anhydride and diphenyl phosphinic acid anhydride;

bisphosphinic acid anhydrides: anhydrides of bisphosphinic acids, in particular alkanebisphosphinic acids with 1 to 10 carbons in the alkane group;

examples include methane-1,1-bismethyl-phosphinic acid anhydride, ethane-1,2-bismethyl-phosphinic acid anhydride, ethane-1,2-bisphenyl-phosphinic acid anhydride and butane-1,4-bismethyl-phosphinic acid anhydride;

phosphonic acid anhydrides: anhydrides of phosphonic acids with alkyl, alkenyl, cycloalkyl, aryl or aralkyl groups;

examples include methanephosphonic acid anhydride, ethanephosphonic acid anhydride, propanephosphonic acid anhydride, hexanephosphonic acid anhydride and benzenephosphonic acid anhydride;

phosphonic acid half-esters: preferably, half-esters, i.e. monoesters of phosphonic acids with alkyl groups (preferably with 1 to 6 C atoms) or with aryl groups (in particular benzenephosphonic acid) with aliphatic alcohols, in particular low-boiling aliphatic alcohols, such as methanol and ethanol are used;

examples include methanephosphonic acid monomethyl ester, propanephosphonic acid monoethyl ester and benzenephosphonic acid monomethyl ester.

Phosphonic acid half-esters can be synthesized by partial hydrolysis of the corresponding phosphonic acid diesters, in particular by means of sodium hydroxide solution, or by partial esterification of the free phosphonic acids with the corresponding alcohol.

Synthesis of phosphorus-modified epoxy resins of this type is also described in German Patent Applications Nos. 4,308,184 and 4,308,185.

In general, both aliphatic and aromatic glycidyl compounds as well as the mixtures thereof can be used to produce phosphorus-modified epoxy resins. Preferred are bisphenol A diglycidyl ether, bisphenol F diglycidyl ether and polyglycidyl ethers of phenol-formaldehyde and cresol-formaldehyde novolaks, diglycidyl esters of phthalic acid, isophthalic acid, terephthalic acid and tetrahydrophthalic acid as well as mixtures of these epoxy resins. Other polyepoxides that can be used are described in the "Handbook of Epoxy Resins" by Henry Lee and Kris Neville, McGraw-Hill Book Company, 1967, and in the monograph "Epoxy Resins" by Henry Lee, American Chemical Society, 1970.

Of the range of possible phosphorus-modified epoxy resins, those that have proven especially favorable for the production of electrolaminates that are stable in a solder bath include phosphonic acid-modified epoxy resins such as methyl, ethyl and propyl phosphonic acid-modified epoxy resins, in particular with a phosphorus content between 2 and 5 wt %. In addition, phosphorus-modified epoxy resins with an average of at least one epoxy functionality, in particular those with an average of at least two epoxy functionalities are advantageous. Such phosphorus-modified epoxy resins can be produced by reacting epoxy novolak resins with a functionality of approx. 3 to 4 with phosphonic acid anhydrides. The phosphorus-modified epoxy resins contain 0.5 to 13 wt % phosphorus, preferably 1 to 8 wt %. The total phosphorus content of the epoxy resin mixtures, i.e., the impregnation resin mixtures, is 0.5 to 5 wt %, preferably 1 to 4 wt %.

The epoxy resin mixtures according to this invention preferably also contain a phosphorus-free epoxy resin or a glycidyl group-free compound with phenolic OH groups. The phosphorus-free epoxy resin is obtained by reacting bisphenol A diglycidyl ether with a substoichiometric quantity of bisphenol A. The glycidyl group-free compound is bisphenol A, bisphenol F or a high-molecular phenoxy resin synthesized by condensation of bisphenol A or bisphenol F with epichlorohydrin.

Adding the phosphorus-free epoxy resin serves to achieve certain properties in the laminates produced from the epoxy resin mixtures. The production and structure of such solid resins are described in H. Batzer "Polymer Materials," vol. III(Technology 2), Georg Thieme Verlag, Stuttgart 1984, pages 178 ff. These are high-molecular, chain-lengthened bisphenol A diglycidyl ethers with an epoxy value of 0.22 to 0.29 equivalents per 100 g. Phosphorus-free epoxy resins with an epoxy value of 0.22 to 0.25 equivalents per 100 g are preferably used in the epoxy resin mixtures according to this invention. The viscosity of these resins, measured at 120° C., is between 300 and 900 mPa·s. The total phosphorus-free epoxy resin content of the epoxy resin mixture is between 0 and 30 wt %, preferably between 0 and 10 wt %. The phosphorus-free epoxy resin component may be added only in an amount such that the total phosphorus content of the mixture is still sufficient to meet the flame resistance requirement according to the UL 94 V. Therefore, more phosphorus-free epoxy resin can be added in the presence of phosphorus-modified epoxy resins having a high phosphorus content than in the case of epoxy resins with a low phosphorus content.

The glycidyl group-free compound with phenolic OH groups is also added to achieve certain properties. Bisphenol A and bisphenol F as well as phenoxy resins are used for this purpose. These are linear condensation products of bisphenol A or bisphenol F and epichlorohydrin in the form of high-molecular compounds with a molecular weight of up to 30,000. The terminal phenolic OH function content is very low at <<1%. Synthesis and properties of such phenoxy resins are known (see "Encyclopedia of Polymer Science and Engineering" (second edition), vol. 6, pages 331 and 332, John Wiley & Sons, Inc. 1986). The compound with phenolic OH groups is added to the epoxy resin mixtures according to this invention in amounts of 0 to 20 wt %, preferably 0 to 10 wt %. Here again, it should be recalled that the glycidyl group-free phenolic component may be added only up to an amount at which the flame resistance requirement according to the UL 94 V specification is met.

The hardener used in the epoxy resin mixtures according to this invention is dicyandiamide and/or a second hardener component based on aminobenzoic acid. Examples of this hardener component include 2-aminobenzoic acid, 4-aminobenzoic acid, 4-amino-2-methylbenzoic acid, 4-aminobenzoic acid amide, 4-aminobenzoic acid dimethyl amide and 4-aminobenzoic acid hydrazide, where 4-aminobenzoic acid is preferred. Both dicyandiamide and the second hardener component may be used alone, but it is also advantageous to use hardener mixtures, where mixtures of dicyanodiamide and 4-aminobenzoic acid are preferred, especially in a weight ratio of 3.5:1 to 2:1. If prepregs and laminates are produced from epoxy resin mixtures according to this invention containing such a hardener mixture, they surprisingly yield an optimum combination of the properties that are important industrially for prepregs, such as solder bath resistance and storage stability.

The hardener is used in a concentration such that the equivalent ratio between the epoxy function and the active hydrogen function (NH or COOH function) in the epoxy resin mixtures according to this invention is 1:0.4 to 1:1.1, preferably 1:0.5 to 1:0.8. It should be pointed out that when a phosphorus-free phenolic component is added, the concentration of epoxy groups is reduced according to the phenolic OH group content. In general, the hardener content of the resin mixture is 0.5 to 35 wt %, preferably 2 to 12 wt %.

Japanese Patent Application 58-142913 discloses resin compositions containing polymaleimides, aminobenzoic acid amides and epoxy resins. These compositions are suitable for producing glass laminates, but without halogen these laminates do not have a flame resistance that would comply with UL 94 V.

The tertiary amines and imidazoles conventionally used to cure epoxy resins are used as the amino hardening accelerators. Suitable amines include, for example, tetramethylethylenediamine, dimethyloctylamine, dimethylaminoethanol, dimethylbenzylamine, 2,4,6-tris(dimethylaminomethyl)phenol, N,N'-tetramethyl-diaminodiphenylmethane, N, N'-dimethylpiperazine, N-methyl-morpholine, N-methylpiperidine, N-ethylpyrrolidine, 1,4-diazabicyclo[2.2.2]octane and quinolines. Suitable imidazoles include, for example, 1-methylimidazole, 2-methylimidazole, 1,2-dimethylimidazole, 1,2,4,5-tetramethylimidazole, 2-ethyl-4-methylimidazole, 1-cyanoethyl-2-phenylimidazole and 1-(4,6-diamino-s-triazinyl-2-ethyl)-2-phenylimidazole. The accelerator is used in a concentration of 0.01 to 2 wt %, preferably 0.05 to 1 wt %, each based on the epoxy resin mixture.

To prepare the prepreg, the various components, either separately or together, are dissolved in inexpensive solvents such as acetone, methyl ethyl ketone, ethyl acetate, methoxyethanol, dimethylformamide and toluene or in mixtures of such solvents, optionally combined to one solution. The solution is then processed on conventional impregnation facilities, i.e., for impregnating fibers of organic or inorganic materials such as glass, metal, minerals, carbon, aramide, polyphenylene sulfide and cellulose as well as the woven or nonwoven fabrics produced from them or for coating flat shaped articles such as films of metals or plastics. The impregnation solutions may optionally also contain additional halogen-free additives to improve the flame resistance, some of which may be homogeneously dissolved or dispersed. Such additives may include, for example, melamine cyanurates, melamine phosphates, pulverized polyether imide, polyether sulfone and polyimide.

Mainly glass fiber fabric is used to produce prepregs for circuit board technology. In particular, types of glass fiber fabric with a surface density of 25 to 200 g/m$^2$ are used for multilayer circuit boards. Prepregs with low surface densities can also be produced to conform to requirements with impregnation solutions of the type described above. The impregnated or coated reinforcing materials and embedding components are dried at an elevated temperature at which the solvent is removed while at the same time the impregnation resin undergoes prepolymerization. On the whole this yields an extraordinarily favorable ratio of cost to achievable properties.

The resulting coatings and prepregs are not tacky and they are stable in storage for three months or more at room temperature, i.e., they have an adequate stability in storage.

They can be processed by compression molding at temperatures up to 220° C. to yield composites that are characterized by high glass transition temperatures of up to 170° C. and by an inherent flame resistance. For example, if glass fiber fabric with a percentage by mass content of 60% through 62%, based on the laminate, is used as the embedding material, it will pass the UL 94 V burning test with a safe V-0 classification without the addition of halogen compounds or other flame-retardant additives—even if the test object has a wall thickness of 1.6 mm or even 0.8 mm. It has proven to be especially advantageous that no corrosive or especially toxic cleavage products are formed and much less smoke is generated in comparison with other polymer materials, in particular bromine-containing epoxy resin molded compounds.

The laminates produced from the epoxy resin mixtures according to this invention, in particular when a hardener mixture is used, are characterized by a combination of good properties attractive for industrial use, such as the adhesive strength to copper, interlaminar adhesion, solder bath resistance and stability in storage.

This invention will now be illustrated in greater detail on the basis of practical embodiments (all parts are parts by weight).

EXAMPLE 1

Production of prepregs

A solution of A parts dicyandiamide (DCD) in H parts dimethylformamide (DMF) is mixed with a solution of C parts of a phosphorus-modified epoxy resin (P/EP resin) in the form of a reaction product (epoxy value 0.32 mol/100 g; phosphorus content 3.8%) of an epoxidized novolak (epoxy value 0.56 mol/100 g; average functionality 3.6) and propanephosphonic acid anhydride in G parts methyl ethyl ketone (MEK) and I parts ethyl acetate (EA). Then D parts 2-methylimidazole (MeIm) are added to the resin solution. Glass fiber fabrics (fabric type 7628, surface density 197 g/m$^2$) are impregnated continuously with the resulting impregnation resin solution on a laboratory impregnation installation and then dried in a vertical dryer at temperatures of 50° C. to 1600° C. Prepregs produced in this way are tack-free. Table 1 shows the composition of the impregnation resin solution and the properties of the prepregs.

EXAMPLES 2 THROUGH 5

Production of prepregs

The procedure described in Example 1 is followed, but the impregnation resin solutions are also mixed with B parts 4-aminobenzoic acid (ABA) and E parts of an epoxy resin (EP resin) dissolved in J parts dimethylformamide (DMF). The epoxy resin (epoxy value 0.25 mol/100 g; viscosity at 120° C. 380 mPa·s) is produced by reacting bisphenol A diglycidyl ether with a substoichiometric quantity of bisphenol A. Table 1 shows the composition of the impregnation resin solutions and the properties of the prepregs.

EXAMPLE 6

Production of prepregs

The procedure described in Example 1 is followed, but the impregnation resin solution is also mixed with B parts 4-aminobenzoic acid (ABA) and F parts of a phenoxy resin (phen resin) dissolved in J parts dimethylformamide (DMF). The phenoxy resin (molecular weight 25,000 to 30,000; hydroxyl value 6%) is a glycidyl group-free linear condensate of bisphenol A and epichlorohydrin. Table 1 shows the composition of the impregnation resin solution and the properties of the prepregs.

TABLE 1

Composition of the impregnation resin solutions and properties of the prepregs

| Example no. | 1 | 2 | 3 | 4 | 5 | 6 | 7 |
|---|---|---|---|---|---|---|---|
| Components (parts) | | | | | | | |
| A (DCD) | 4.9 | 3.5 | 3.0 | 3.0 | 2.5 | 3.0 | — |
| B (ABA) | — | 1.0 | 1.5 | 2.0 | 3.0 | 1.5 | 12 |
| C (P/EP resin) | 95 | 85 | 86 | 85 | 84 | 86 | 88 |
| D (MeIm) | 0.1 | 0.1 | 0.1 | 0.1 | 0.1 | 0.1 | — |
| E (EP resin) | — | 10 | 10 | 10 | 10 | — | — |
| F (phen resin) | — | — | — | — | — | 10 | — |
| G (MEK) | 66 | 70 | 70 | 70 | 70 | 50 | 66 |
| H (DMF) | 29 | 6 | 6 | 6 | 6 | 6 | 30 |
| I (EA) | 5 | 4 | 4 | 4 | 4 | 4 | 4 |
| J (DMF) | — | 20 | 20 | 20 | 20 | 40 | — |
| Measured values: | | | | | | | |
| Residual solvent content (%) | 0.2 | 0.2 | 0.2 | 0.2 | 0.2 | 0.2 | 0.2 |
| Residual gel time after 3 months (in % of starting value) | 90 | 93 | 90 | 75 | 30 | 60 | gelled |

The residual gel time is determined by applying glass fiber-free impregnation resin (0.2 to 0.3 g) mechanically separated from the prepregs to a hot plate preheated to 170° C. After approx. 30 sec, the fused resin specimen is stirred uniformly with a glass or wooden rod. The change in viscosity is observed by pulling approximately 50 mm long filaments out of the melt. Gelation has occurred if no filaments can be pulled any longer. The gel time is the period of time (in seconds) determined with a stop watch from applying the resin to the hot plate until the premature breaking of the filaments.

EXAMPLE 7

Comparative experiment

The procedure in Example 1 is followed, but the impregnation resin solution is mixed with B parts 4-aminobenzoic acid (ABA) dissolved in H parts dimethylformamide (DMF) —instead of A parts dicyandiamide (DCD). In addition, no hardening accelerator (D) is added. Table 1 shows the composition of the impregnation resin solution and the properties of the prepregs.

EXAMPLE 8 THROUGH 14

Producing and testing laminates

Eight of each prepreg produced according to Examples 1 through 7 (glass fiber fabric type 7628, surface density 197 g/m$^2$), laminated on both sides with a 35 μm copper foil, are pressed by compression molding in a press at 175° C. and 20 bar. The 1.5 to 1.6 mm thick laminates are removed from the press after 40 minutes and then after-baked for 2 hours at 175° C. The glass transition temperature $T_G$ is determined on the resulting test objects by dynamic mechanical analysis (DMTA), in addition to determining the flammability according to UL 94 V, the adhesion of the copper foil, the Measling test, the high-pressure cooker test and the solder bath resistance. Table 2 shows the values thus obtained.

TABLE 2

Properties of the laminates

| Example no. | 8 | 9 | 10 | 11 | 12 | 13 | 14 |
|---|---|---|---|---|---|---|---|
| Prepregs acc. to example No. | 1 | 2 | 3 | 4 | 5 | 6 | 7 |
| Measured values | | | | | | | |
| $T_G$ (°C.) | 170 | 168 | 161 | 156 | 160 | 155 | 160 |
| Average burning time acc. to UL 94 V (sec) | 2.7 | 4.7 | 4.9 | 4.7 | 4.8 | 4.4 | 3.9 |
| Classification | V-0 | V-0 | V-0 | V-0 | V-0 | V-0 | V-0 |
| Adhesion of the of the copper foil at room temp. (N/mm) | 48 | 52 | 53 | 49 | 49 | 51 | 47 |
| Measling test (LT26) | + | + | + | + | + | + | + |
| High-pressure cooker test (sec) | 12 | 18 | >20 | >20 | >20 | >20 | >20 |
| Solder bath resistance at 288° C. (sec) | 50 | 115 | 115 | 125 | 144 | 95 | >600 |

The tests performed on the laminates were carried out as follows:
Adhesion of the copper lamination
 A 25 mm-wide and 100 mm-long strip of the copper foil is separated from the glass-reinforced laminate for a length of 20 mm and pulled away vertically at a pull-away speed of 50 mm/min using a suitable device. The force F (N) required to accomplish this is measured.
Measling test
 The test is performed on test objects without copper lamination (size: 20 mm×100 mm). The test objects are immersed for 3 minutes in a 65° C. LT26 solution (composition: 850 ml deionized water, 50 ml HCl, analytical purity, 100 g SnCl$_2$·2H$_2$O, 50 g thiourea), rinsed with running water and then placed in boiling water for 20 minutes. After drying in air (2 to 3 minutes), the sample is immersed in a solder bath at 260° C. for 10 seconds. The laminate must not delaminate in this test.

High-pressure cooker test

Two test objects measuring 50 mm ×50 mm are stored in a steam atmosphere at a temperature of 120°–125° C. in a high-pressure autoclave for two hours. Then within 2 minutes, the dried samples are placed in a solder bath at 260° C. for 20 seconds. The test objects must not delaminate.

Solder bath resistance

This test is performed according to DIN IEC 259 using a solder bath according to section 3.7.2.3, using test objects measuring 25 mm ×100 mm that are immersed in a solder bath at a temperature of 288° C., and the time until delamination occurs or bubbles develop is measured.

What is claimed is:

1. An epoxy resin mixture for producing prepregs and composites, comprising:
    a phosphorus-modified epoxy resin with an epoxy value of 0.02 to 1 mol/100 g, which is a reaction product of
        (a) polyepoxy compounds with at least two epoxy groups per molecule, and
        (b) phosphinic acid anhydrides, phosphonic acid anhydrides or phosphonic acid half-esters;
    dicyandiamide and/or an aromatic amine of the following structure as a hardener:

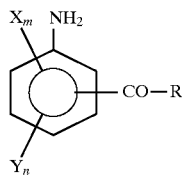

where
    X is a hydrogen atom and Y is an alkyl group with 1 to 3 C atoms, and m and n denote an integer from 0 to 4 where m+n=4,
    R is an OH or NR$^1$ R$^2$ group, where the R$^1$ and R$^2$ groups, independently of each other, denote a hydrogen atom, an alkyl group with 1 to 3 C atoms or an aralkyl group or one of the R$^1$ and R$^2$ groups has this meaning and the other group is an NR$^3$R$^4$ group, where R$^3$ and R$^4$=H or an alkyl group with 1 to 3 C atoms, or R$^1$ and R$^2$ together with the nitrogen may form a heterocyclic group; and
    an amino hardening catalyst.

2. Epoxy resin mixture according to claim 1, which contains a phosphorus-free epoxy resin prepared by reacting bisphenol A diglycidyl ether with a substoichiometric quantity of bisphenol A, or a glycidyl group-free compound with phenolic OH groups selected from the group consisting of bisphenol A, bisphenol F and a phenoxy resin obtained by condensation of bisphenol A or bisphenol F with epichlorohydrin.

3. Epoxy resin mixture according to claim 2, wherein the phosphorus-free epoxy resin content in the resin mixture is up to 30 wt %.

4. Epoxy resin mixture according to claim 3, wherein the phosphorus-free epoxy resin content in the resin mixture is up to 10 wt %.

5. Epoxy resin mixture according to claim 2, wherein the amount of the glycidyl group-free compound in the resin mixture is up to 20 wt %.

6. Epoxy resin mixture according to claim 5, wherein the amount of the glycidyl group-free compound in the resin mixture is up to 10 wt %.

7. Epoxy resin mixture according to claim 1, wherein the phosphorus content is 0.5 to 5 wt %, based on the resin mixture.

8. Epoxy resin mixture according to claim 7 wherein the phosphorus content is 1 to 4 wt %, based on the resin mixture.

9. Epoxy resin mixture according to claim 1, wherein the equivalent ratio between epoxy functions and NH functions is 1:0.4 to 1:1.1.

10. Epoxy resin mixture according to claim 9 wherein the equivalent ratio between epoxy functions and NH functions is 1:0.5 to 1:0.8.

11. Epoxy resin mixture according to claim 1, wherein the hardener content of the resin mixture is 0.5 to 35 wt %.

12. Epoxy resin mixture according to claim 11, wherein the hardener content of the resin mixture is 2 to 12 wt %.

13. Epoxy resin mixture according to claim 1, wherein the hardener is 2-aminobenzoic acid, 4-aminobenzoic acid, 4-amino-2-methylbenzoic acid, 4-aminobenzoic acid amide, 4-aminobenzoic acid dimethylamide or 4-aminobenzoic acid hydrazide.

14. A prepreg based on organic or inorganic reinforcing materials in the form of fibers, wovens or nonwovens or flat shaped articles, produced from the epoxy resin mixture according to claim 1.

15. A composite based on organic or inorganic reinforcing materials in the form of fibers, wovens or nonwovens or flat shaped articles, produced from the epoxy resin mixture according to claim 1.

16. A circuit board made of prepregs, produced from glass fiber fabrics and the epoxy resin mixture according to claim 1.

17. Epoxy resin mixture according to claim 1, wherein the hardener is a mixture of dicyandiamide and 4-aminobenzoic acid.

* * * * *